(12) United States Patent
Ramaswamy et al.

(10) Patent No.: US 12,205,797 B2
(45) Date of Patent: Jan. 21, 2025

(54) SOLID-STATE SWITCH BASED HIGH-SPEED PULSER WITH PLASMA IEDF MODIFICATION CAPABILITY THROUGH MULTILEVEL OUTPUT FUNCTIONALITY

(71) Applicant: Applied Materials, Inc., Santa Clara, CA (US)

(72) Inventors: Kartik Ramaswamy, San Jose, CA (US); Yue Guo, Redwood City, CA (US); Yang Yang, San Diego, CA (US); Fernando Silveira, Santa Clara, CA (US); A. N. M. Wasekul Azad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 233 days.

(21) Appl. No.: 18/059,222

(22) Filed: Nov. 28, 2022

(65) Prior Publication Data

US 2024/0177969 A1 May 30, 2024

(51) Int. Cl.
*H01J 37/32* (2006.01)

(52) U.S. Cl.
CPC .. *H01J 37/32174* (2013.01); *H01J 37/32128* (2013.01); *H01J 37/32146* (2013.01); *H01J 2237/3341* (2013.01)

(58) Field of Classification Search
CPC ........... H01J 37/32174; H01J 37/32128; H01J 37/32146; H01J 2237/3341
See application file for complete search history.

(56) References Cited

U.S. PATENT DOCUMENTS

| 2014/0232266 A1 | 8/2014 | Finley et al. |
| 2021/0366723 A1 | 11/2021 | Voronin |
| 2022/0037119 A1 | 2/2022 | Dorf et al. |
| 2023/0395360 A1* | 12/2023 | Shihommatsu ... H01J 37/32816 |

FOREIGN PATENT DOCUMENTS

| KR | 1020210122233 A | 10/2021 |
| WO | 2017126184 A1 | 7/2017 |

OTHER PUBLICATIONS

International Search Report/ Written Opinion issued to PCT/US2023/078403 on Feb. 27, 2024.

* cited by examiner

*Primary Examiner* — Henry Luong
(74) *Attorney, Agent, or Firm* — Patterson + Sheridan, LLP

(57) ABSTRACT

Embodiments provided herein generally include apparatus, plasma processing systems, and methods for generation of a waveform for plasma processing of a substrate in a processing chamber. One embodiment includes a waveform generator having three MOSFETs and three series-connected capacitors. The capacitors are connected across a DC power supply and, depending on the value of the capacitors, voltage across each of them may be varied. Each of the top two capacitors is followed by a diode. The bottom capacitor is connected to the ground. The drain terminal of each MOSFET is connected to higher potential end of the series connected capacitors. Each MOSFET is followed by a diode and the cathode ends of the diodes are connected together. An electrode is connected between the common cathode and ground.

17 Claims, 12 Drawing Sheets

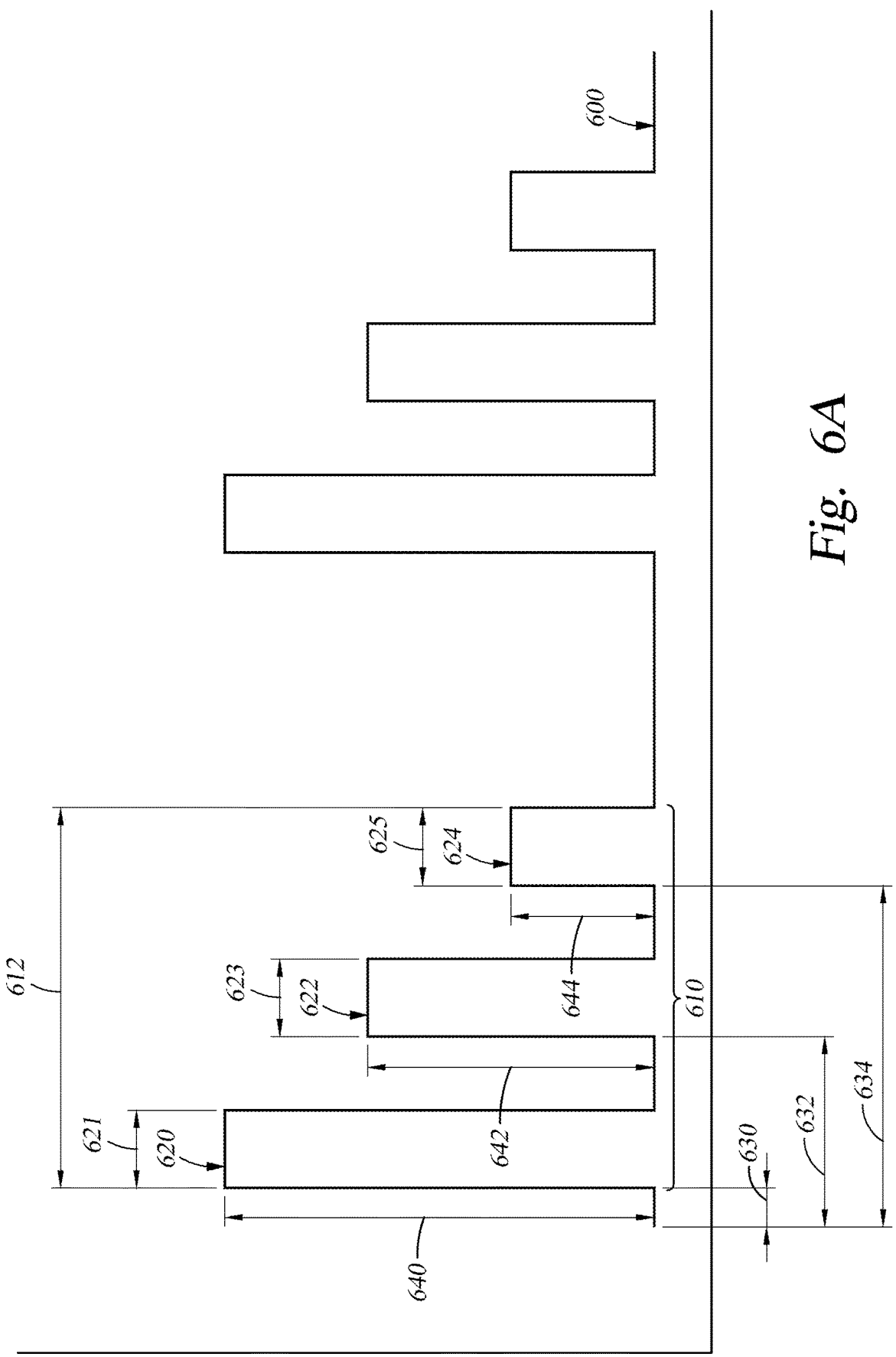

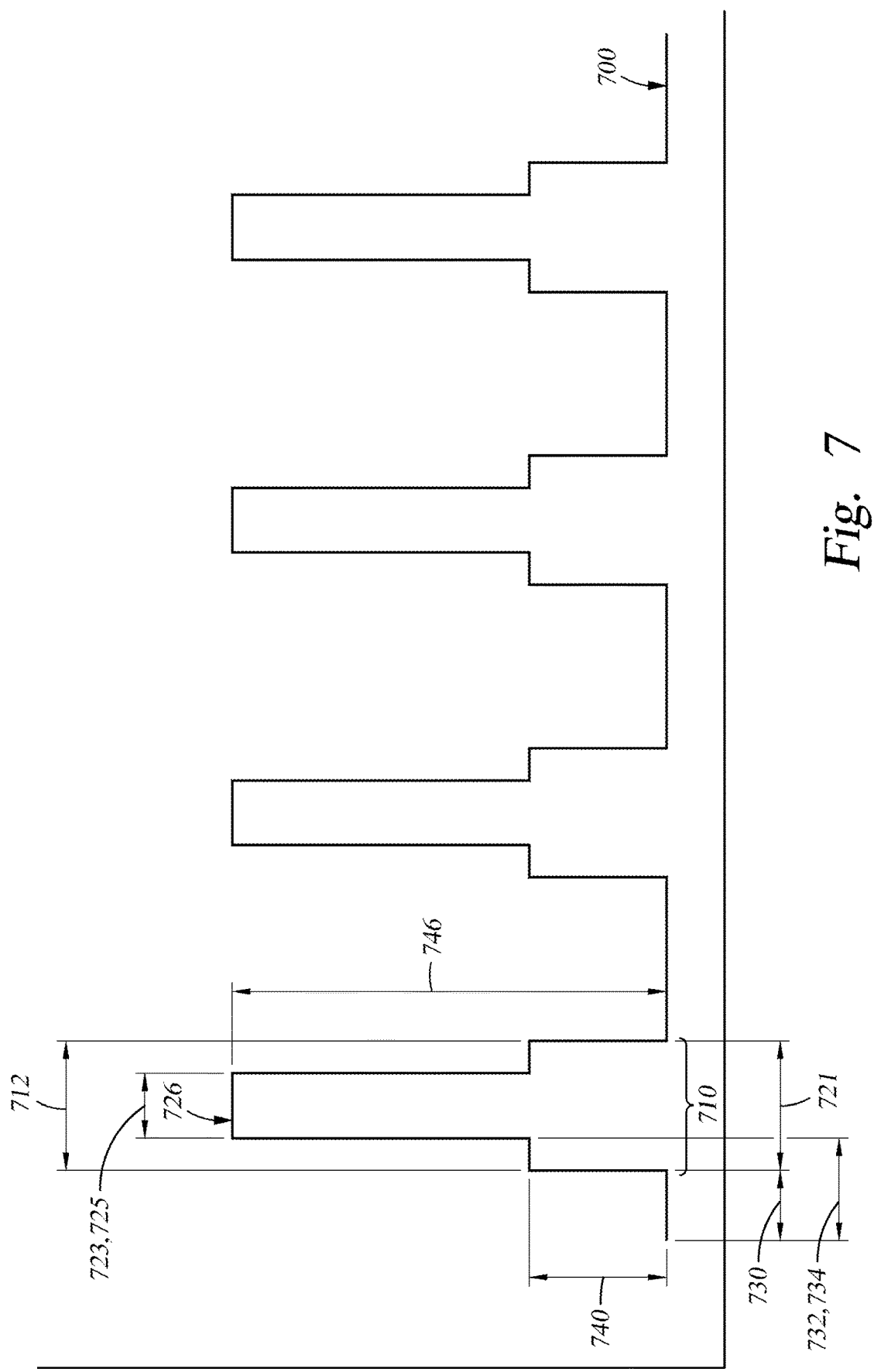

SOLID-STATE SWITCH BASED HIGH-SPEED PULSER WITH PLASMA IEDF MODIFICATION CAPABILITY THROUGH MULTILEVEL OUTPUT FUNCTIONALITY

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Low temperature, non-equilibrium glow discharge plasma is a powerful tool for semiconductor device fabrication, primarily used for etching and deposition of thin films as wells as for ion implantation among a wide variety of uses. As the semiconductor industry ventures into the regime of sub-10 nm, high aspect ratio features are becoming increasingly desirable in the semiconductor industry. One of the popular methods of achieving high aspect ratio with reliable throughput is reactive ion etching (RIE). In this process, plasma is traditionally formed using a radio-frequency (RF) source and ions inside the plasma accelerate toward a substrate surface under the influence of a biasing voltage applied to a metal plate known as a cathode. The cathode can be coupled to the plasma using capacitive coupling through a dielectric layer.

RF voltage bias applied to the cathode of a chamber creates an electron-repelling plasma sheath over the substrate surface which acts like a nonlinear diode resulting in a negative cathode potential with respect to positive plasma potential. The RF cathode bias leads to a dual-peak Ion Energy Distribution Function (IEDF). The ions with lower energy contribute to its isotropic nature resulting in bowing of the sidewall of the high aspect feature, while the high energy ions reach the bottom end of the feature with greater sputtering. The increased level of sputtering may compromise etch selectivity and may cause unwanted etching of the mask layer. Therefore, additional control knobs are required relating to the biasing source to fine tune the selectivity feature while producing high aspect ratio feature.

To that end, multiple RF bias sources have been incorporated in some of the latest chamber designs to enable additional level of etch controls. Multiple RF bias sources, however, can cause arcing problems and crosstalk issues. Pulsed plasma sources present a unique platform that can mitigate the foregoing issues associated with RF bias sources and help improve the etch selectivity, throughput, and uniformity.

Traditionally, pulsed power sources provide pulsed DC bias to the cathode. With these designs, switching frequency and power dissipation capability must be taken into account. As the device dimension decreases, the complexity of the semiconductor tools increases exponentially. Being essential to semiconductor fabrication tools employing plasma etching processes, DC bias supplies are undergoing changes which include increased peak amplitudes and switching frequencies, multilevel pulsing, and robust cooling mechanisms. Inductive adder-based and metal oxide semiconductor field effect transistor (MOSFET)-based DC power supplies are the two primary types of DC power supplies that are suited for semiconductor tools. However, inductive adder-based DC power supplies are limited in operating switching frequency due to the limited flux density swing of the magnetic cores. In addition, weight of the magnetic cores leads to a bulky power supply with significant footprint. MOSFET-based power supplies, however, have superior switching capability, particularly silicon carbide (SiC) and gallium nitride (GaN) MOSFETs. Additionally, these solid-state switch-based supplies can deliver similar or better performance with a smaller footprint due to the compact size of the MOSFETs. However, as the switching frequency increases, switching loss increases proportionally leading to complex cooling mechanisms.

Accordingly, there is a need for pulsed DC bias sources with switching frequencies high enough to control the critical high aspect ratio features, etch selectivity, and uniformity of RIE.

SUMMARY

Embodiments described herein generally relate to a system used in semiconductor device manufacturing. More specifically, embodiments of the present disclosure relate to a plasma processing system used to process a substrate using a bias pulsing scheme to produce micropulses.

In an embodiment, a system for reactive ion etching comprises a chamber body, a substrate support within the chamber body, a bias electrode within the substrate support, and a bias voltage source configured to supply a pulsed biasing voltage to the electrode. The bias voltage source comprises a DC voltage source, a first capacitor connected to the DC voltage source, a ground, a first diode in series between the first capacitor and ground, a first resistor connected to the DC voltage source, a first metal oxide semiconductor field effect transistor (MOSFET) in series with the first resistor, a first gate voltage source connected to a gate of the first MOSFET, a first blocking diode connected to a source of the first MOSFET, a second capacitor in series between the first diode and ground, a second diode in series between the second capacitor and ground, a second resistor connected between the first diode and the second capacitor, a second MOSFET in series with the second resistor, a second gate voltage source connected to a gate of the second MOSFET, and a second blocking diode connected to a source of second first MOSFET.

In another embodiment, a method for etching using a pulsed waveform is provided. The method comprises generating a plasma in a chamber body applying a pulsed DC voltage to the plasma using a bias electrode capacitively coupled to the plasma through a dielectric layer, wherein the pulsed DC voltage comprises a plurality of pulses, each of the plurality of pulses further comprising a plurality of signals, and wherein each of the plurality of signals has an off-time, a pulse width, and an amplitude, and etching a substrate in the chamber body using the pulsed DC voltage applied to the plasma. the DC voltage source is connected in series to a second capacitor connected in series with between the first diode and ground, a second diode connected in series between the second capacitor and ground, a second resistor connected in parallel with the second capacitor, a second MOSFET connected in series to the second resistor, a second gate voltage source connected to a gate terminal of the second MOSFET, and a second blocking diode connected to a source terminal of the second MOSFET. the DC voltage source is connected in series to a second capacitor connected in series with between the first diode and ground, a second diode connected in series between the second capacitor and ground, a second resistor connected in parallel with the second capacitor, a second MOSFET connected in series to the second resistor, a second gate voltage source connected to a gate terminal of the second MOSFET, and a second blocking diode connected to a source terminal of the second MOSFET. The first MOSFET receives a first gating signal from the first gate voltage source, the first gating signal having a first pulse width, and wherein the second MOSFET receives a second gating signal from the second gate voltage source, the second gating signal having a second pulse width.

In yet another embodiment, a pulsed signal source device for etching is provided. The pulsed signal source device comprises a controller, a bias electrode, and a bias voltage source configured to supply a pulsed biasing voltage to the bias electrode. The bias voltage source comprises a DC voltage source, a first capacitor connected in series with the DC voltage source, a first diode connected with the first capacitor, a ground connected in series with the first diode, a first resistor connected in parallel with the first capacitor, a first MOSFET connected in series to the first resistor, a first gate voltage source connected to a gate terminal of the first MOSFET, a second capacitor connected in series with between the first diode and ground, a second diode connected in series between the second capacitor and ground, a second resistor connected in parallel with the second capacitor, a second MOSFET connected in series to the second resistor, a second gate voltage source connected to a gate terminal of the second MOSFET, a second blocking diode connected to a source terminal of the second MOSFET, a third capacitor connected in series with between the second diode and ground, a third resistor connected in parallel with the third capacitor, a third MOSFET connected in series to the third resistor, a third gate voltage source connected to a gate terminal of the third MOSFET, and a third blocking diode connected to a source terminal of the third MOSFET.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

FIG. 6A illustrates a voltage waveform that is established on a substrate due to a voltage waveform applied to an electrode of a processing chamber.

FIG. 7 illustrates a voltage waveform that is established on a substrate due to a voltage waveform applied to an electrode of a processing chamber.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein are generally directed electronic device manufacturing and, more particularly, to systems and methods for forming low resistivity tungsten features in a semiconductor device manufacturing scheme.

The present disclosure includes a metal oxide semiconductor field effect transistor (MOSFET)-based three-stage topology configured to produce customizable multilevel output waveforms and increase the effective output frequency while masking the switching frequency limitation of the current generation MOSFETs. The embodiments of the present disclosure produce customizable voltage output waveforms catered towards dynamic Ion Energy Distribution Function (IEDF) to add unique tuning knobs in plasma etch recipes. Further, the effective output efficiency of the pulser is increased based on the number of stages and gating signal patterns. The embodiments in the present disclosure also mask the switching frequency limitation of the current generation MOSFETs and reducing the corresponding cooling requirements while generating pulses with different widths in a single output burst and produce a lighter and faster alternative to inductive adder-based pulsers.

Figure 1:
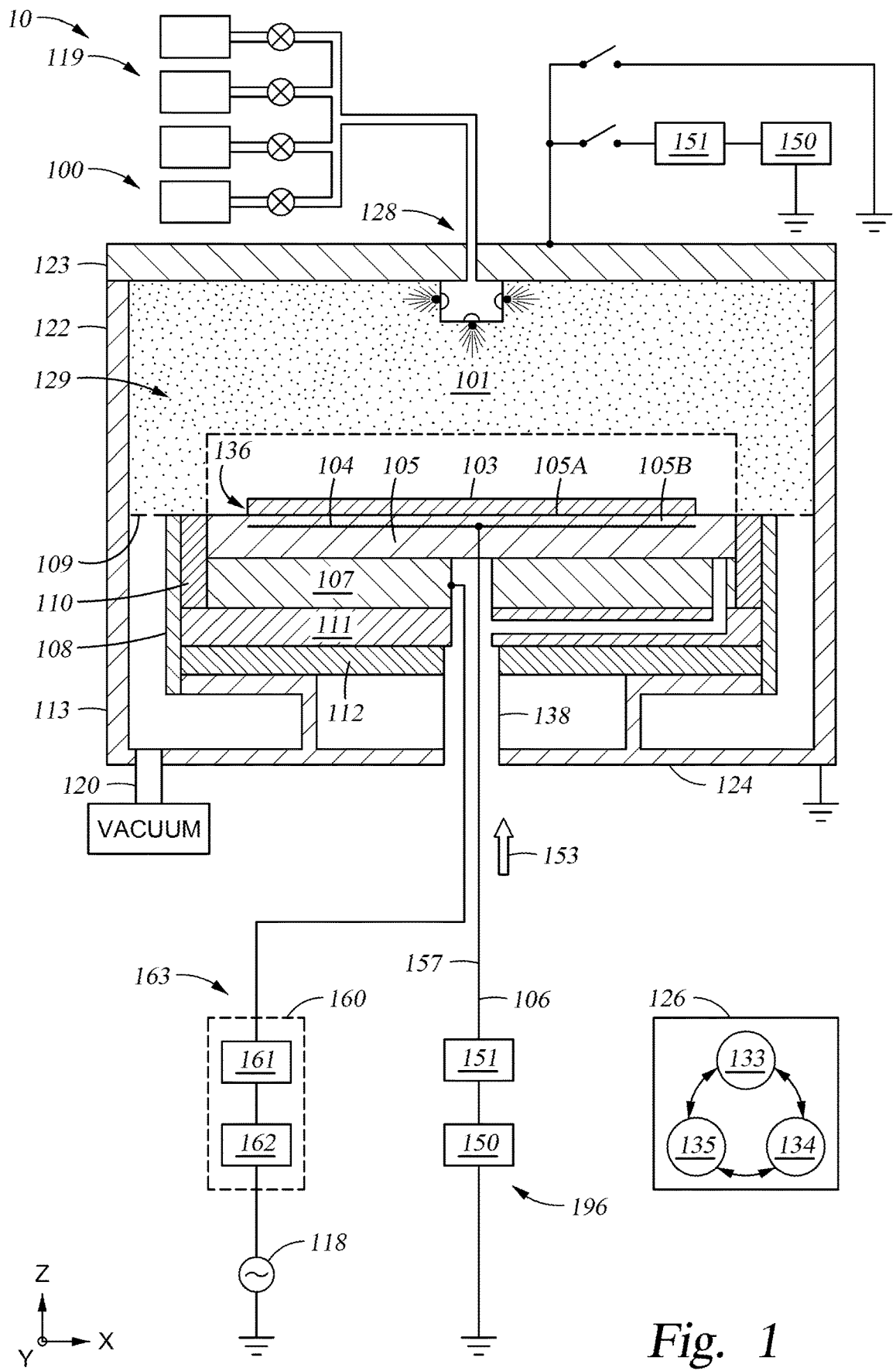
FIG. 1 is a schematic cross-sectional view of a processing system, according to one or more embodiments, configured to practice the methods set forth herein.

FIG. 1 is a schematic cross-sectional view of a processing system 10 configured to perform one or more of the plasma processing methods set forth herein. In some embodiments, the processing system 10 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown, the processing system 10 is configured to form a capacitively coupled plasma (CCP), and includes a processing chamber 100 that includes an upper electrode (e.g., chamber lid 123) disposed adjacent a processing volume 129 facing a lower electrode (e.g., substrate support assembly 136) disposed in the processing volume 129 opposite the upper electrode. In a typical capacitively coupled plasma (CCP) processing system, a radio frequency (RF) source (e.g., RF generator 118) is electrically coupled to one of the upper or lower electrode (in FIG. 1, the lower electrode), and delivers an RF signal configured to ignite and maintain a plasma (e.g., plasma 101). In this configuration, the plasma is capacitively coupled to each of the upper and lower electrodes and is disposed in the processing volume 129 between the upper and lower electrodes. Typically, the opposing one of the upper or lower electrodes (in FIG. 1, the upper electrode) is coupled to ground or to a second RF power source. In one embodiment as shown in FIG. 1, one or more components of the substrate support assembly 136, such as the support base 107 is electrically coupled to a plasma generator assembly 163, which includes the RF generator 118, and the chamber lid 123 is electrically coupled to ground. As shown, the processing system 10 includes the processing chamber 100, the support assembly 136, and a system controller 126.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while the plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103. The substrate 103 is supported by the substrate support assembly 136. The substrate support assembly 136 includes a substrate support 105 configured to support the substrate 103 thereon, the support base 107 disposed below the substrate support 105, an insulator plate 111 disposed below the support base 107, and a ground plate 112 disposed below the insulator plate 111.

In some embodiments, the processing chamber 100 further includes a quartz pipe 110, or collar, that at least partially circumscribes portions of the substrate support assembly 136 to prevent the substrate support 105 and the support base 107 from contact with corrosive processing gases or plasma, cleaning gases or plasma, or byproducts thereof. Typically, the quartz pipe 110, the insulator plate 111, and the ground plate 112 are circumscribed by a liner 108. In some embodiments, a plasma screen 109 is positioned between the liner 108 and the one or more sidewalls 122 to prevent plasma from forming in a volume underneath the plasma screen 109 between the liner 108 and the one or more sidewalls 122.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10.

Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10 to perform the various process tasks and various process sequences used to implement the methods described herein.

The processing system may include the plasma generator assembly 163, and a first pulsed voltage (PV) source assembly 196 for establishing a first PV waveform at a bias electrode 104 disposed within the substrate support 105 as described in more detail herein with respect to FIGS. 4-8B. In some embodiments, the plasma generator assembly 163 delivers an RF signal to the support base 107 (e.g., power electrode or cathode) which may be used to generate (maintain or ignite) the plasma 101 in the processing volume 129 disposed between the substrate support assembly 136 and the chamber lid 123. The bias electrode 104 is capacitively coupled to the plasma 101 through a dielectric layer 105B of the substrate support 105. In some embodiments, the RF generator 118 is configured to deliver an RF signal having a frequency that is greater than 1 MHz or more, or about 2 MHz or more, such as about 13.56 MHz or more.

As discussed above, in some embodiments, the plasma generator assembly 163, which includes the RF generator 118 and an RF generator assembly 160, is generally configured to deliver a desired amount of a continuous wave (CW) or pulsed RF power at a desired substantially fixed sinusoidal waveform frequency to the support base 107 of the substrate support assembly 136 based on control signals provided from the system controller 126. During processing, the plasma generator assembly 163 is configured to deliver RF power (e.g., an RF signal) to the support base 107 disposed proximate to the substrate support 105, and within the substrate support assembly 136. The RF power delivered to the support base 107 is configured to ignite and maintain the processing plasma 101 using the processing gases disposed in the processing volume 129 and fields generated by the RF power (RF signal) delivered to the support base 107 by the RF generator 118.

In some embodiments, the support base 107 is an RF electrode that is electrically coupled to the RF generator 118 via an RF matching circuit 162 and a first filter assembly 161, which are both disposed within the RF generator assembly 160.

The processing volume 129 is fluidly coupled to one or more dedicated vacuum pumps through a vacuum outlet 120, which maintain the processing volume 129 at sub-atmospheric pressure conditions and evacuate processing and other gases therefrom. In some embodiments, the substrate support assembly 136, disposed in the processing volume 129, is disposed on a support shaft 138 that is grounded and extends through the chamber base 124.

The substrate support assembly 136 generally includes the substrate support 105 (e.g., electrostatic chuck substrate support) and the support base 107. In some embodiments, the substrate support assembly 136 can additionally include the insulator plate 111 and the ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

In some embodiments, the bias electrode 104 is electrically coupled to a bias voltage source 150, which provides a chucking voltage or pulsed biasing voltage 153 thereto, such as a pulsed DC voltage between about −5000 V and about 5000 V, using an electrical conductor, such as the coaxial power delivery line 106 (e.g., a coaxial cable).

A power delivery line 157 electrically connects the output of the bias voltage source 150 of the first bias voltage source assembly 196 to an optional filter assembly 151 and the bias electrode 104. The electrical conductors within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e). The optional filter assembly 151 includes one or more electrical elements that are configured to substantially prevent a current generated by the output of the RF generator 118 from flowing through the power delivery line 157 and damaging the bias voltage source 150. The optional filter assembly 151 acts as a high impedance (e.g., high Z) to RF signal generated by the RF generator 118, and thus inhibits the flow of current to the bias voltage source 150.

Figure 2A:
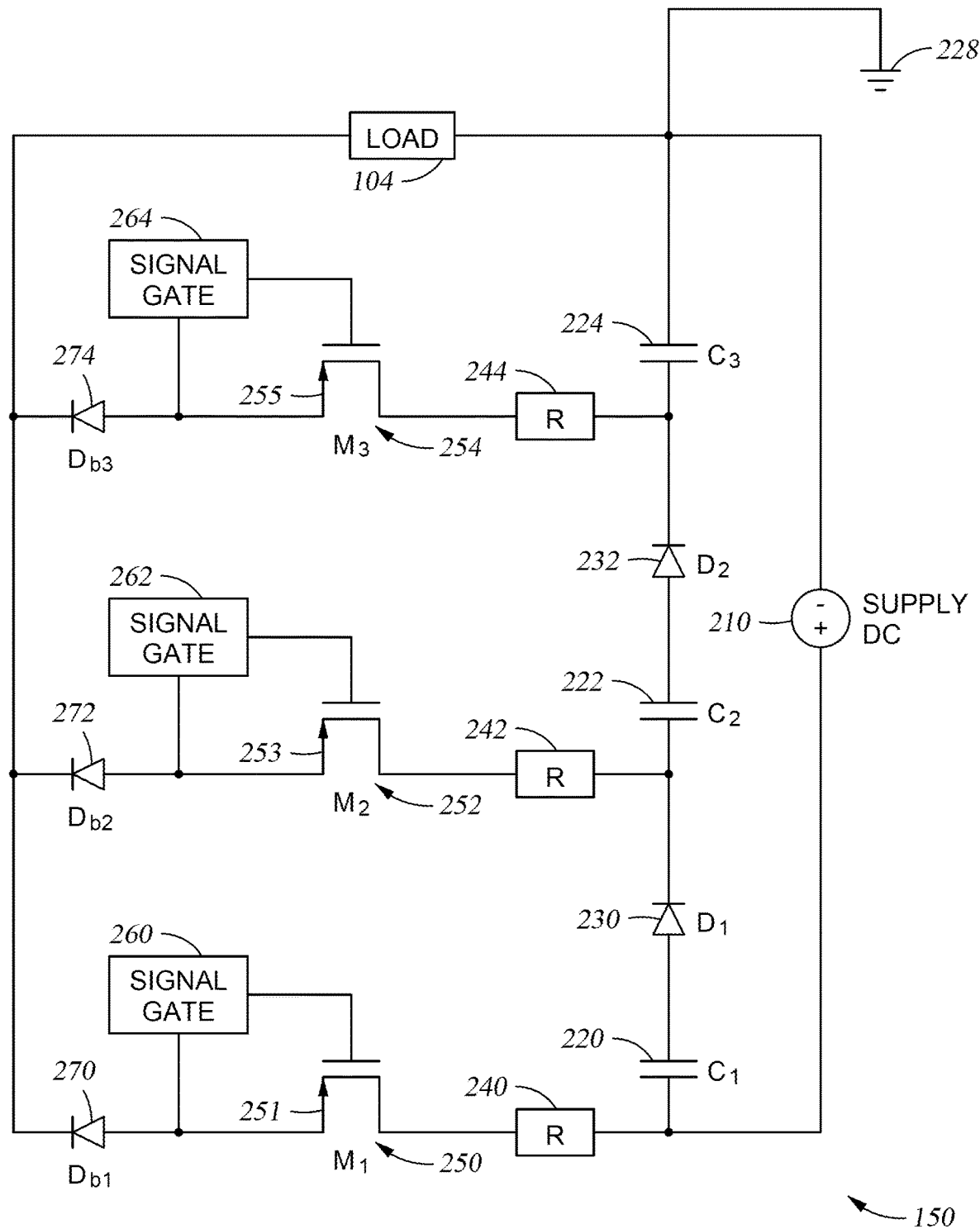
FIG. 2A is a diagram illustrating a solid-state switch-based high speed pulser according to an embodiment of the present disclosure.

FIG. 2A is a schematic diagram of the bias voltage source 150. As shown in FIG. 2A, the bias voltage source 150 comprises a DC voltage source 210, a first capacitor 220 connected to the positive terminal of the DC voltage source 210, and a first diode 230 connected with the first capacitor 220. The bias voltage source 150 further includes a first resistor 240 connected to the positive terminal of the DC voltage source 210, a first MOSFET 250 connected in series to the first resistor 240, a first gate voltage source 260 connected to a gate terminal of the first MOSFET 250, and a first blocking diode 270 connected to a source terminal 251 of the first MOSFET 250. The bias voltage source 150 may also include a second capacitor 222 connected in series between the first diode 230 and ground 228, and a second diode 232 connected in series between the second capacitor 222 and ground 228. As shown, the second capacitor 222 is connected in series between the first diode 230 and the second diode 232. A second resistor 242 may be connected at the common point of the first diode 230 and the second capacitor 222. A second MOSFET 252, a second gate voltage source 262, and second blocking diode 272 may also be connected in series with the second resistor 242, where the cathode of the second blocking diode 272 is connected to the cathode of the first blocking diode 270. As shown, the bias voltage source 150 may also include a third capacitor 224 connected in series between the second diode 232 and ground 228. Further, a third resistor 244 may be connected at the common point of the second diode 232 and the third capacitor 224. A third MOSFET 254, a third gate voltage source 264, and third blocking diode 274 may also be connected in series with the third resistor 244, where the cathode of the third blocking diode 274 is connected to the bias electrode 104. The full supply voltage will be applied to the load when all the MOSFETs are gated ON at the same time and the widths of the gating signals are identical.

The effective output frequency can be increased three times by turning the MOSFETs (e.g., 250, 252, and 254) on at different time stamps. Although the effective output frequency is increased using this scheme, each MOSFET operates at a switching frequency which is one-third of the effective output switching frequency. In addition, using a combination of the widths and delays of the gate signals, a wide range of multilevel output voltage waveforms can be generated that corresponds to unique IEDFs that can be a unique addition in plasma etch recipes. By leveraging these features offered by the present disclosure, the selectivity, uniformity, and throughput of the RIE can be increased significantly.

Figure 2B:
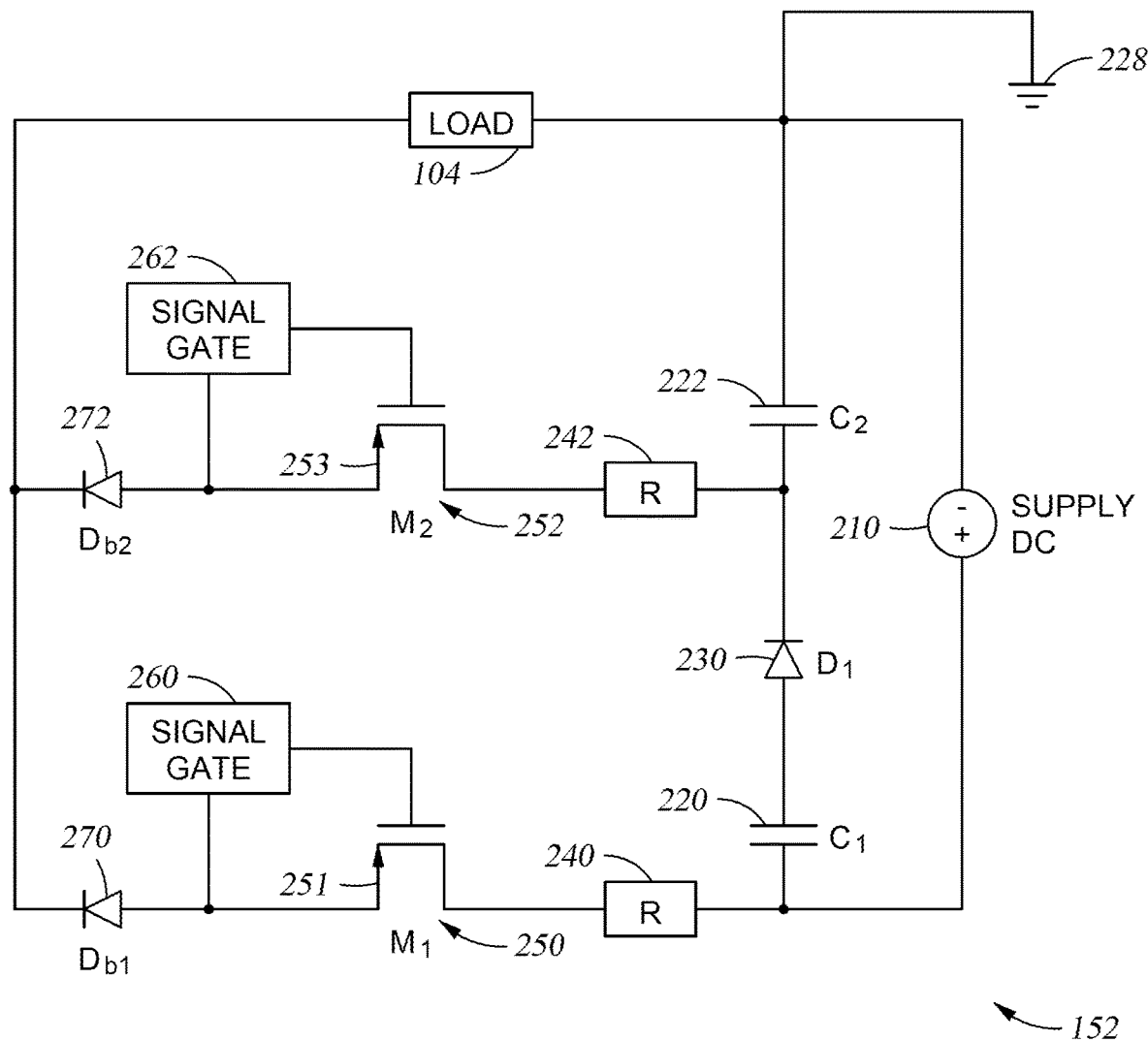
FIG. 2B is a diagram illustrating a solid-state switch-based high speed pulser according to an embodiment of the present disclosure.

Alternatively, as shown in FIG. 2B, the bias voltage source 150 may comprise the first resistor 240 to the positive terminal of the DC voltage source 210, the first MOSFET 250 connected in series to the first resistor 240, the first gate voltage source 260 connected to the gate terminal of the first MOSFET 250, and the first blocking diode 270 connected to the source terminal 251 of the first MOSFET 250. Further, the second capacitor 222 may be connected in series between the first diode 230 and ground 228. The bias voltage source 152 may also include the second resistor 242 connected at the common point of the first diode 230 and the second capacitor 222. The second MOSFET 252 may be connected in series to the second resistor 242, the second gate voltage source 262 connected to a gate terminal of the second MOSFET 252, and a second blocking diode 272 connected to the source terminal 253 of the second MOSFET 252. In this embodiment, the electrode 140 is electrically coupled to the second blocking diode 272 of the bias voltage source 152.

Figure 3:
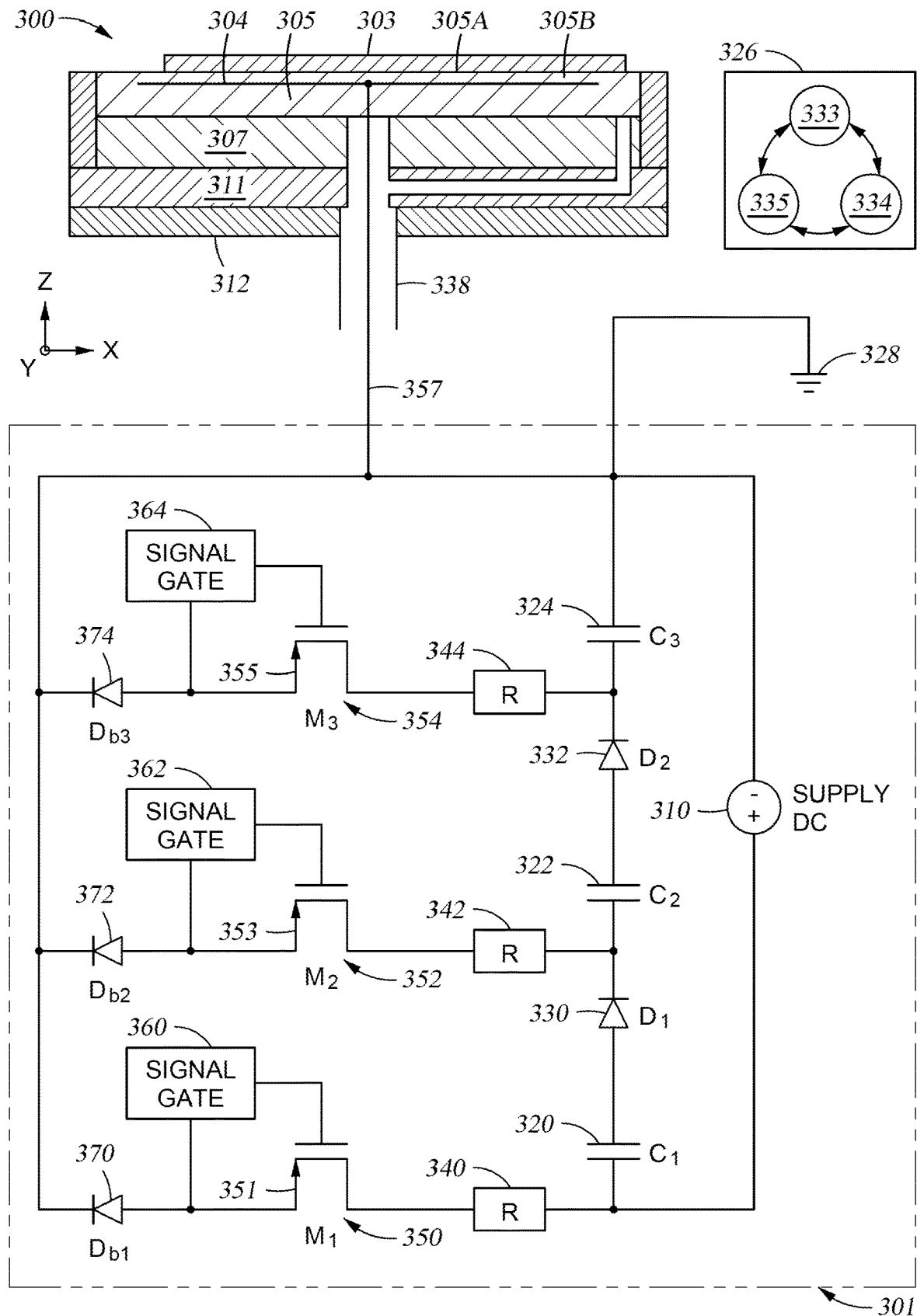
FIG. 3 is a schematic cross-sectional view of a device, according to one or more embodiments, configured to practice the methods set forth herein.

FIG. 3 is a schematic diagram of a pulsed signal source device 300. The pulsed signal source device 300 includes a substrate support (e.g., electrostatic chuck) 305 made of a dielectric material and configured to support a substrate 303 on a substrate support surface 305A, a support base 307, an insulator plate, a ground plate 312, and a support shaft 338. The pulsed signal source device 300 further includes an electrode 304 disposed in the substrate support 305 and configured to be capacitively coupled to a plasma through a dielectric layer 305B and a bias voltage source 301 configured to supply a pulsed biasing voltage to the electrode 304. The bias voltage source 301 includes a DC voltage source 310, a first capacitor 320 connected in series with the DC voltage source 310, a first diode 330 connected with the first capacitor 320, a first resistor 340 connected to the positive terminal of the DC voltage source 310 at one end, a first MOSFET 350 connected in series to the first resistor 340, a first gate voltage source 360 connected to a gate terminal of the first MOSFET 350, and a first blocking diode 370 connected to a source terminal 351 of the first MOSFET 350. The bias voltage source 301 further includes a second capacitor 322 connected in series between the first diode 330 and a second diode 332 that is connected in series between the second capacitor 322 and ground 328, a second resistor 342 connected at the common connection point between the first diode 330 and the second capacitor 322, a second MOSFET 352 connected in series to the second resistor 342, a second gate voltage source 362 connected to a gate terminal of the second MOSFET 352, and a second blocking diode 372 connected to a source terminal 353 of the second MOSFET 352. Further, a third capacitor 324 is connected in series between the second diode 332 and ground 328, and a third resistor 344 is connected at the common connection point between the second diode 332 and the third capacitor 324. Additionally, a third MOSFET 354 is connected in series to the third resistor 344, a third gate voltage source 364 connected to a gate terminal of the third MOSFET 354, and a third blocking diode 374 connected to a source terminal of the third MOSFET 354. The memory 334, the CPU 333, and the support circuits 335 of the system controller 326 (which is similar to the system controller 126) may alter the pulse width, duration, and amplitude according to the present disclosure as further described below.

Figure 4:
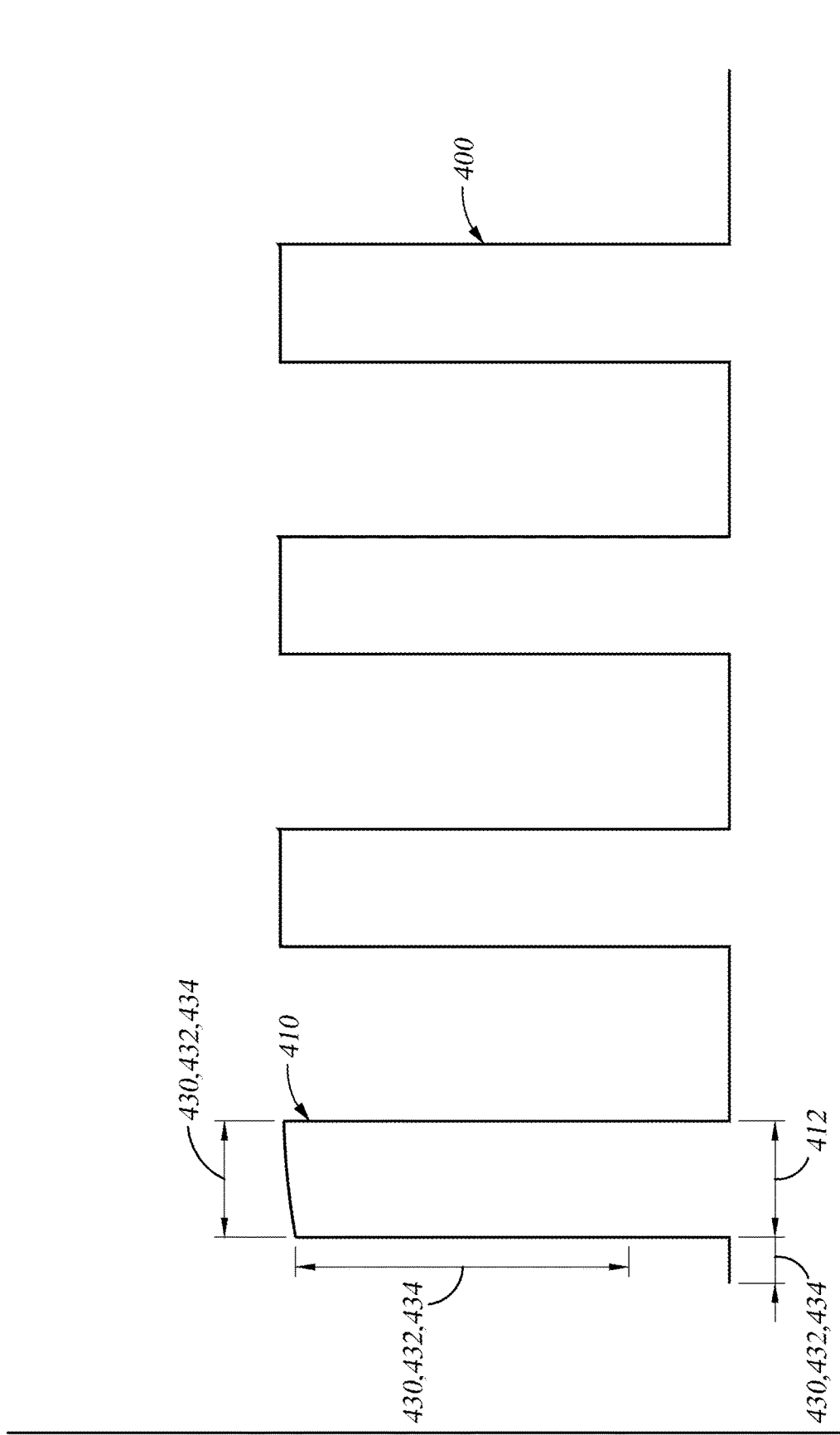
FIG. 4 illustrates a voltage waveform that is established on a substrate due to a voltage waveform applied to an electrode of a processing chamber.

FIG. 4 illustrates a pulsed voltage-biasing scheme using a waveform 400, according to certain embodiments of the present disclosure. As shown, waveform 400 comprises a plurality of pulses 410. Each of the plurality of pulses 410 comprises a total pulse width 412. Within each of the plurality of pulses 410, a first MOSFET, a second MOSFET, and a third MOSFET generate a first signal 420 having a first pulse width 421, second signal 422 having a second pulse width 423, and a third signal 424 having a third pulse width 425. Each signal also includes an OFF-time ($T_{off}$) where each signal is in an OFF state, such as a first $T_{off}$ 430 for the first signal 420, a second $T_{off}$ 432 for the second signal 422, and a third $T_{off}$ 434 for the third signal 434. The first $T_{off}$ 430 may be the duration between pulses or before the beginning of an initial pulse where at least the first MOSFET is gated OFF and, typically, where all MOSFETs are gated OFF. Additionally, each signal has its respective amplitude, such as a first amplitude 440, a second amplitude 442, and a third amplitude 444.

In FIG. 4, each of the MOSFETs are gated ON simultaneously and provide the same voltage, resulting in the first signal 420, the second signal 422, and the third signal 424 having the same amplitude (e.g., 440, 442, and 444 are equal), $T_{off}$ (e.g., 430, 432, and 434 are equal), and pulse width (e.g., 421, 423 and 425 are equal).

Figure 5:
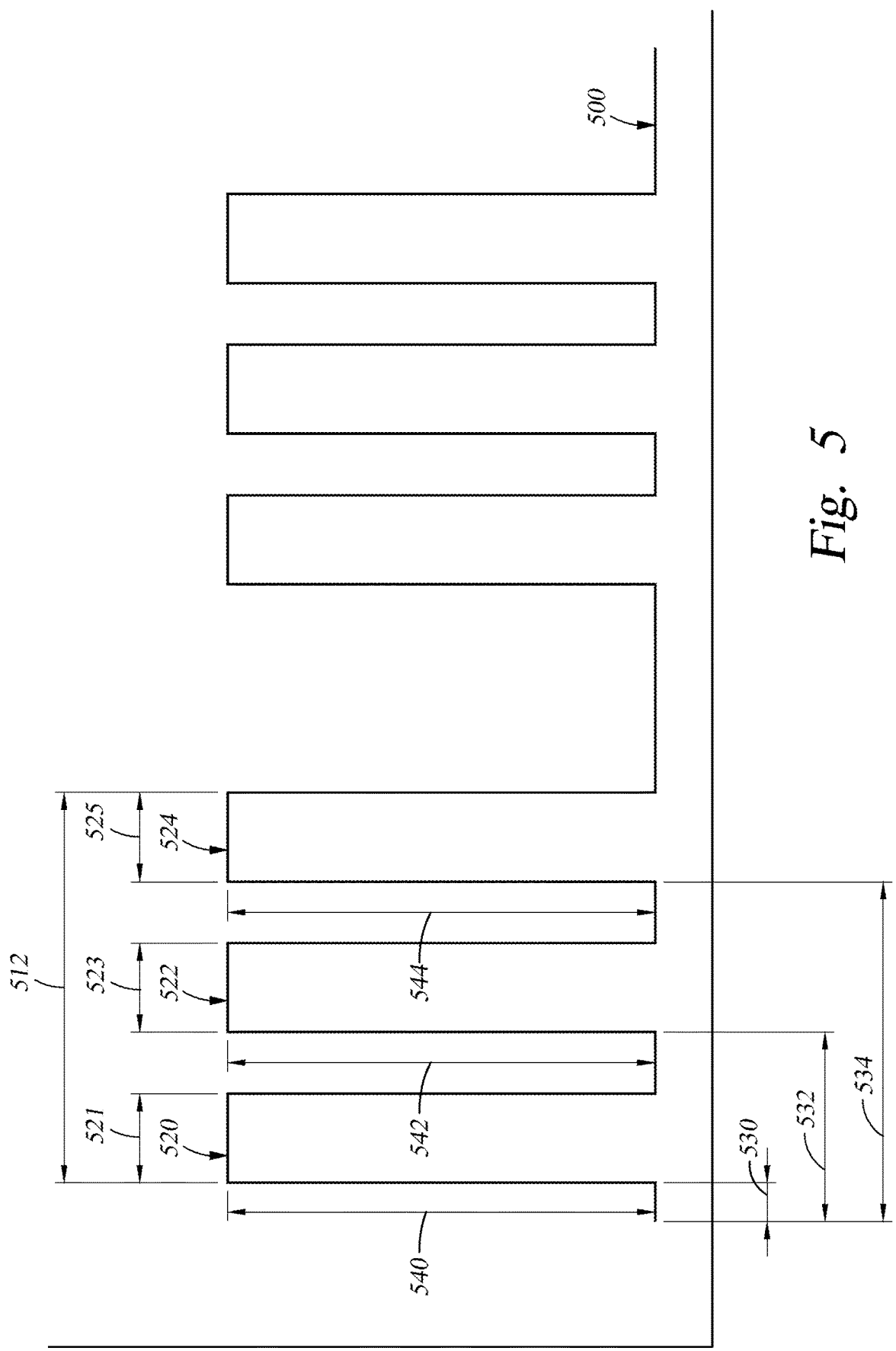
FIG. 5 illustrates a voltage waveform that is established on a substrate due to a voltage waveform applied to an electrode of a processing chamber.

FIG. 5 illustrates a pulsed voltage-biasing scheme using a waveform 500, according to certain embodiments of the present disclosure. As shown, waveform 500 comprises a plurality of pulses 510. The plurality of pulses 510 comprises a total pulse width 512. Within the plurality of pulses 510, a first MOSFET, a second MOSFET, and a third MOSFET generate a first signal 520 having a first pulse width 521, second signal 522 having a second pulse width 523, and a third signal 524 having a third pulse width 525. Each signal also includes a $T_{off}$, such as a first $T_{off}$ 530 for the first signal 520, a second $T_{off}$ 532 for the second signal 522, and a third $T_{off}$ 534 for the third signal 534. Additionally, each signal has its respective amplitude, such as a first amplitude 540, a second amplitude 542, and a third amplitude 544.

In FIG. 5, each of the MOSFETs are gated ON then OFF sequentially, but each MOSFET provides the same voltage at the same pulse width. This results in the first signal 520, the second signal 522, and the third signal 524 having the same amplitude (e.g., 540, 542, and 544 are equal) and pulse width (e.g., 521, 523 and 525 are equal), but each $T_{off}$ is progressively greater (e.g., 534 is greater than 532, and 532 is greater than 530). Each sequential $T_{off}$ is also greater than the previous pulse width. For example, second $T_{off}$ 532 is greater than the sum of first $T_{off}$ 530 and the first pulse width 521. Further, the third $T_{off}$ 534 is greater than the sum of the first $T_{off}$ 530, the first pulse width 521, the second $T_{off}$ 532, and the second pulse width 523.

FIG. 6A illustrates a pulsed voltage-biasing scheme using a waveform 600, according to certain embodiments of the present disclosure. As shown, waveform 600 comprises a plurality of pulses 610. The plurality of pulses 610 comprises a total pulse width 612. Within the plurality of pulses 610, a first MOSFET, a second MOSFET, and a third MOSFET generate a first signal 620 having a first pulse width 621, second signal 622 having a second pulse width 623, and a third signal 624 having a third pulse width 625. Each signal also includes a $T_{off}$, such as a first $T_{off}$ 630 for the first signal 620, a second $T_{off}$ 632 for the second signal 622, and a third $T_{off}$ 634 for the third signal 634. Additionally, each signal has its respective amplitude, such as a first amplitude 640, a second amplitude 642, and a third amplitude 644.

In FIG. 6A, each of the MOSFETs are gated ON then OFF sequentially and each MOSFET provides a different voltage, but at the same pulse width. This results in the first signal 620, the second signal 622, and the third signal 624 having the same pulse width (e.g., 621, 623 and 625 are equal) but each $T_{off}$ is progressively greater (e.g., 634 is greater than 632, and 632 is greater than 630) and, in this embodiment, each amplitude is progressively decreased (e.g., 640 is greater than 642, and 642 is greater than 644). Each sequential $T_{off}$ is also greater than the previous pulse width. For example, second $T_{off}$ 632 is greater than the sum of first $T_{off}$ 630 and the first pulse width 621. Further, the third $T_{off}$ 634 is greater than the sum of the first $T_{off}$ 630, the first pulse width 621, the second $T_{off}$ 632, and the second pulse width 623.

Figure 6B:
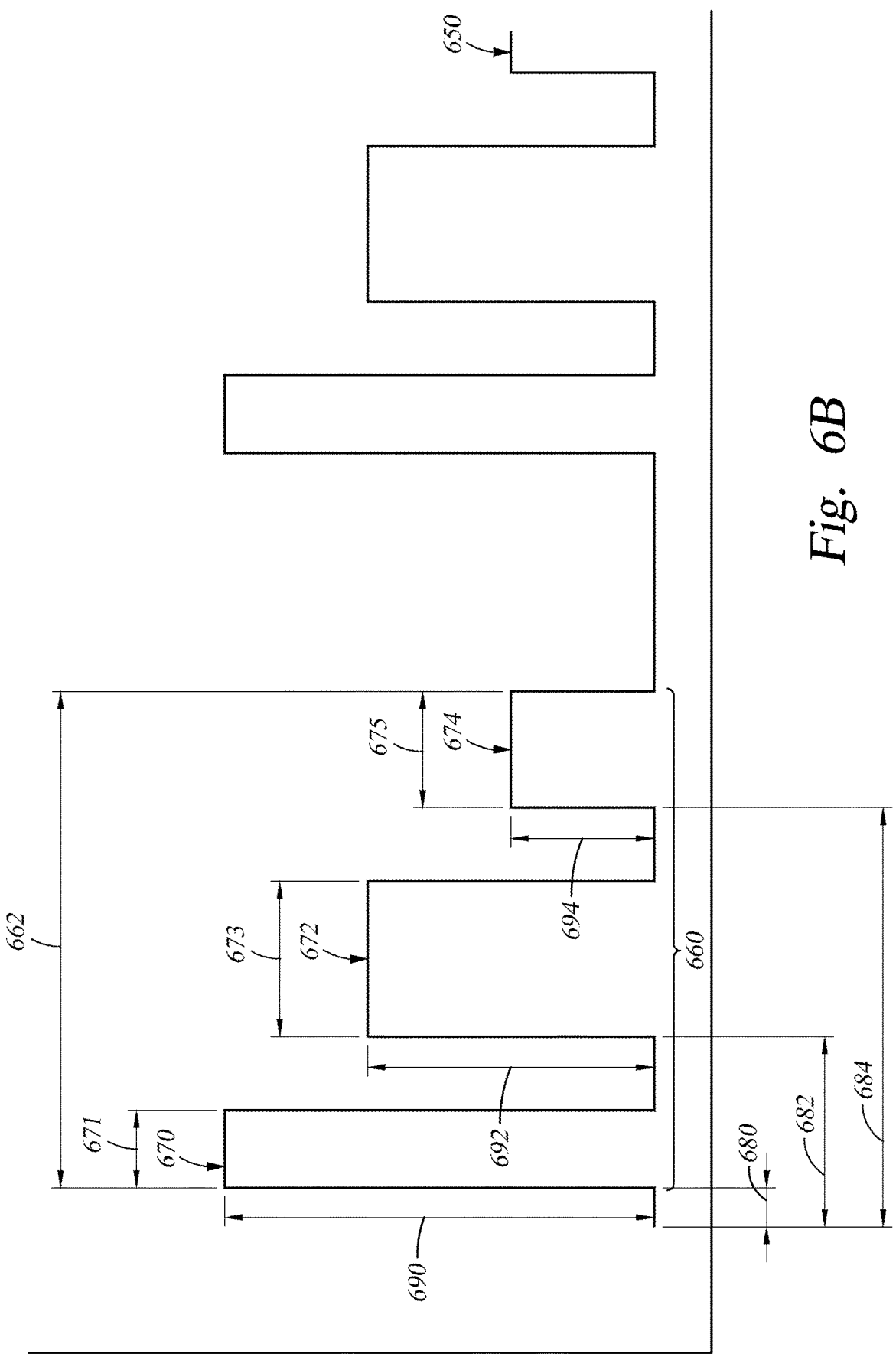
FIG. 6B illustrates a voltage waveform that is established on a substrate due to a voltage waveform applied to an electrode of a processing chamber.

FIG. 6B illustrates a pulsed voltage-biasing scheme using a waveform 650, according to certain embodiments of the present disclosure. As shown, waveform 650 comprises a plurality of pulses 660. The plurality of pulses 660 comprises a total pulse width 662. Within the plurality of pulses 660, a first MOSFET, a second MOSFET, and a third MOSFET generate a first signal 670 having a first pulse width 671, second signal 672 having a second pulse width 673, and a third signal 674 having a third pulse width 675. Each signal also includes a $T_{off}$, such as a first $T_{off}$ 680 for the first signal 670, a second $T_{off}$ 682 for the second signal 672, and a third $T_{off}$ 684 for the third signal 684. Additionally, each signal has its respective amplitude, such as a first amplitude 690, a second amplitude 692, and a third amplitude 694.

In FIG. 6B, each of the MOSFETs are gated ON then OFF sequentially but each MOSFET provides a different voltage and at a different pulse width. This results in the first signal 670, the second signal 672, and the third signal 674 having different pulse widths (e.g., 671, 673 and 675 are not equal), each $T_{off}$ is progressively greater (e.g., 684 is greater than 682, and 682 is greater than 680), and, in this embodiment, each amplitude is progressively decreased (e.g., 690 is greater than 692, and 692 is greater than 694). Each sequential $T_{off}$ is also greater than the previous pulse width. For example, second $T_{off}$ 682 is greater than the sum of first $T_{off}$ 680 and the first pulse width 671. Further, the third $T_{off}$ 684 is greater than the sum of the first $T_{off}$ 680, the first pulse width 671, the second $T_{off}$ 682, and the second pulse width 673.

FIG. 7 illustrates a pulsed voltage-biasing scheme using a waveform 700, according to certain embodiments of the present disclosure. As shown, waveform 700 comprises a plurality of pulses 710. Each of the plurality of pulses 710 comprises a total pulse width 712. Within the plurality of pulses 710, a first MOSFET, a second MOSFET, and a third MOSFET generate a first signal 720 having a first pulse width 721 that may be equal to the total pulse width 712 (e.g., the first MOSFET is gated ON for the duration of the pulse), second signal 722 having a second pulse width 723, and a third signal 724 having a third pulse width 725. As shown, the second pulse width 723 and the third pulse width 725 may be equal. Each signal also includes a $T_{off}$, such as a first $T_{off}$ 730 for the first signal 720, a second $T_{off}$ 732 for the second signal 722, and a third $T_{off}$ 734 for the third signal 724. Additionally, each signal has its respective amplitude, such as a first amplitude 740, a second amplitude 742, and a third amplitude 744.

In FIG. 7, the first MOSFET is gated ON before the second and third MOSFETs. As shown, the first MOSFET is gated ON at the beginning of the pulse. The second and third MOSFETs are gated ON simultaneously after the first MOSFET then gated OFF before the first MOSFET such that their entire pulse width 723, 725 lies within the first pulse width 721 of the first signal 720. In this embodiment, the first, second, and third amplitudes 740, 742, 744 produce an output signal 726 with an amplitude 746 equal to the sum of the first, second, and third amplitudes 740, 742, 744 while the second and third MOSFETs are gated ON. In this embodiment, the second and third pulse widths 723, 725 overlap as a result of their respective $T_{off}$ 732, 734 being equal and greater than the first $T_{off}$ 730.

Figure 8A:
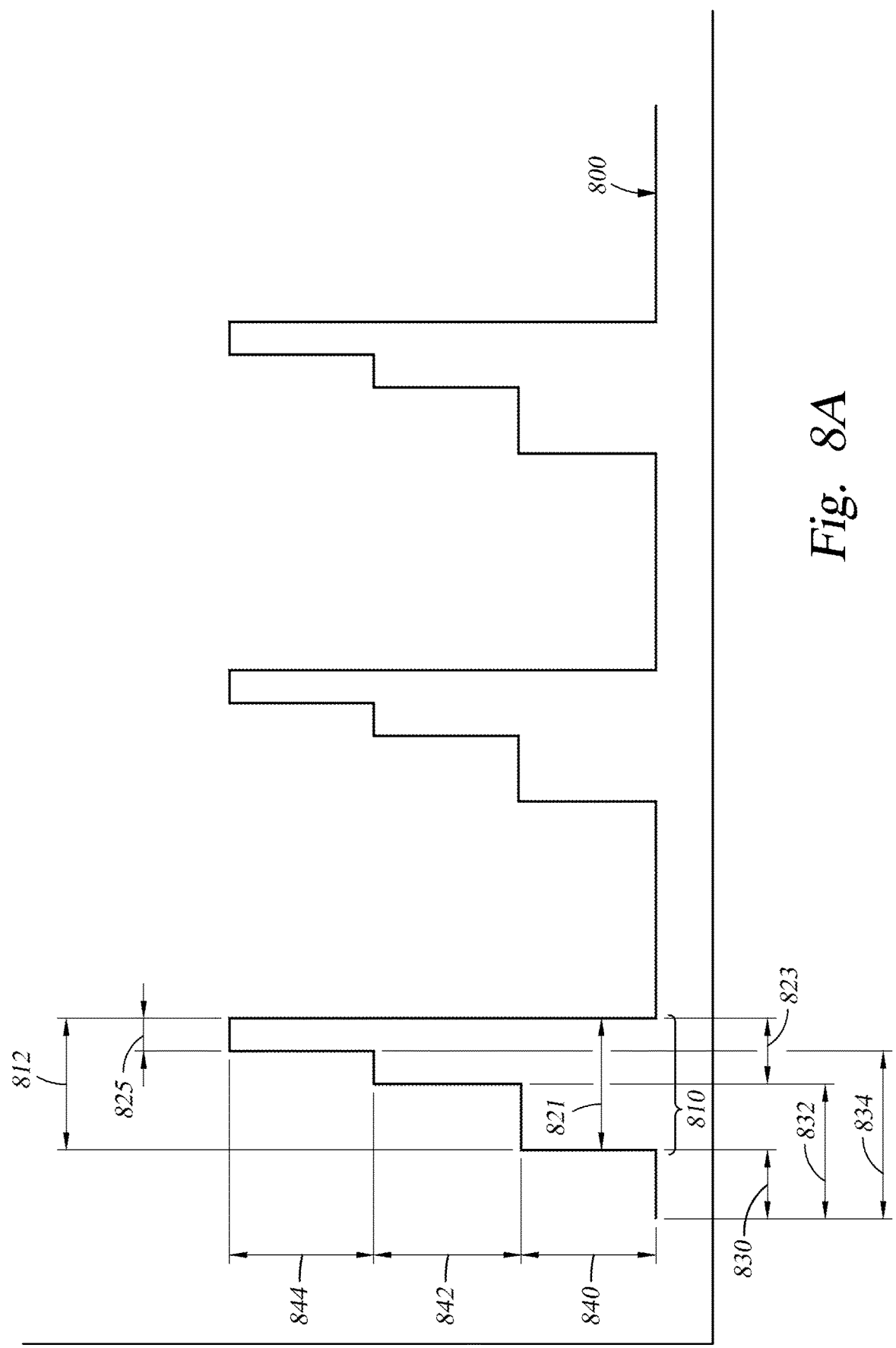
FIG. 8A illustrates a voltage waveform that is established on a substrate due to a voltage waveform applied to an electrode of a processing chamber.

FIG. 8A illustrates a pulsed voltage-biasing scheme using a waveform 800, according to certain embodiments of the present disclosure. As shown, waveform 800 comprises a plurality of pulses 810. The plurality of pulses 810 comprises a total pulse width 812. Within the plurality of pulses 810, a first MOSFET, a second MOSFET, and a third MOSFET generate a first signal 820 having a first pulse width 821, second signal 822 having a second pulse width 823, and a third signal 824 having a third pulse width 825. Each signal also includes a $T_{off}$, such as a first $T_{off}$ 830 for the first signal 820, a second $T_{off}$ 832 for the second signal 822, and a third $T_{off}$ 834 for the third signal 824. Additionally, each signal has its respective amplitude, such as a first amplitude 840, a second amplitude 842, and a third amplitude 844.

In FIG. 8A, each of the MOSFETs are gated ON sequentially then gated OFF simultaneously at the end of the pulse. As shown, the first signal 820, the second signal 822, and the third signal 824 have different pulse widths (e.g., 821, 823 and 825 are not equal). Each $T_{off}$ is progressively greater (e.g., 834 is greater than 832, and 832 is greater than 830), and, in this embodiment, output voltage amplitude (e.g., combination of 840, 842, and 844) increases in a step-wise manner as the second and third MOSFETs are gated ON. For example, when the second MOSFET is gated ON after $T_{off}$ 832, the first signal 820 and the second signal 822 combine to create a first output voltage signal 826. The first output voltage signal 826 has an amplitude 843 equal to the sum of the first amplitude 840 and the second amplitude 842. Similarly, when the third MOSFET is gated ON, the combination of the first signal 820, second signal 822, and the third signal 824 creates a second output voltage signal 828 with an amplitude 845 equal to the sum of the first amplitude 840, the second amplitude 842, and the third amplitude 844.

Figure 8B:
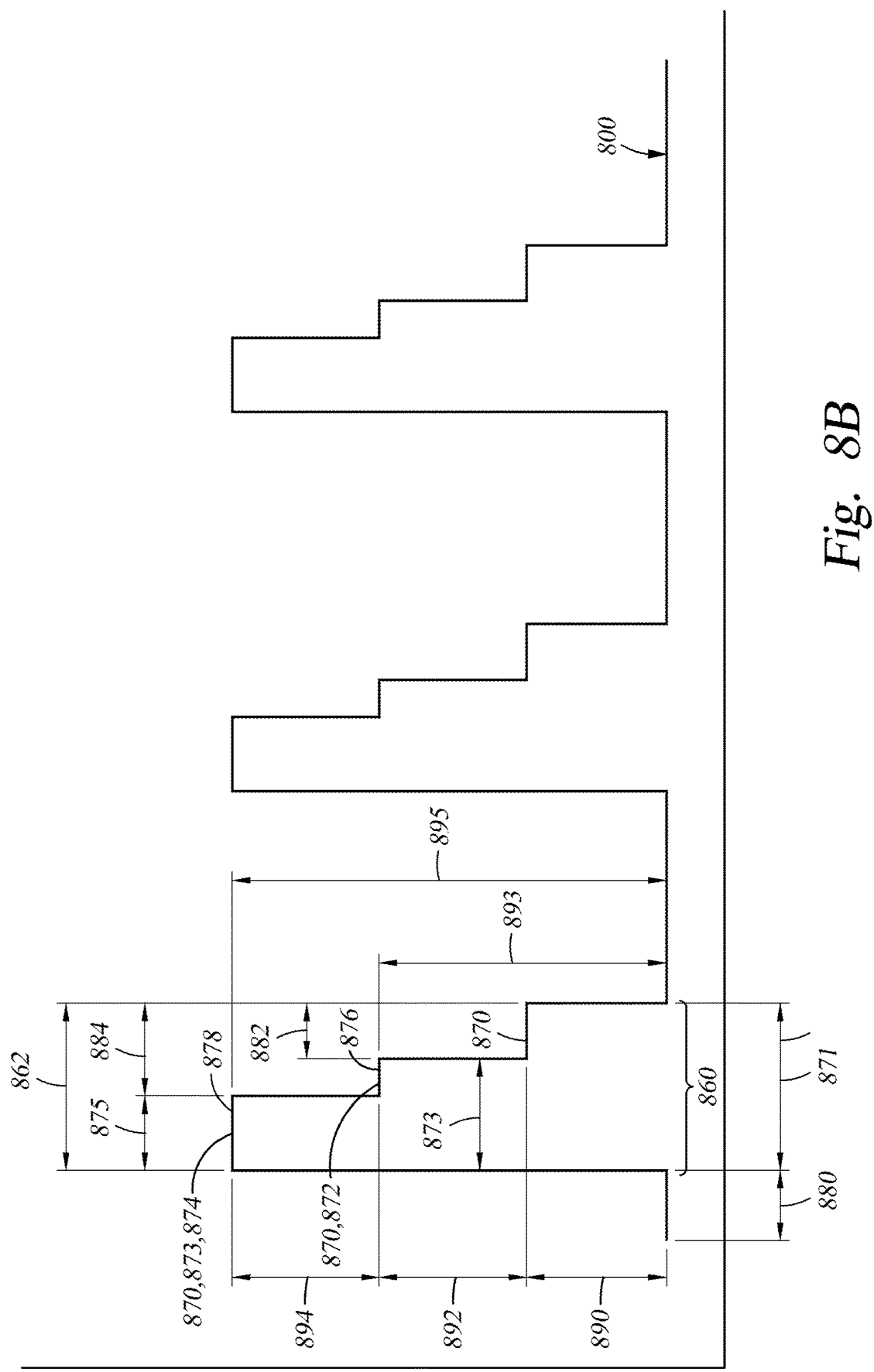
FIG. 8B illustrates a voltage waveform that is established on a substrate due to a voltage waveform applied to an electrode of a processing chamber.

FIG. 8B illustrates a pulsed voltage-biasing scheme using a waveform 850, according to certain embodiments of the present disclosure. As shown, waveform 850 comprises a plurality of pulses 860. The plurality of pulses 860 comprises a total pulse width 862. Within the plurality of pulses 860, a first MOSFET, a second MOSFET, and a third MOSFET generate a first signal 870 having a first pulse width 871, second signal 872 having a second pulse width 873, and a third signal 874 having a third pulse width 875. Each signal also includes a $T_{off}$, such as a first $T_{off}$ 880 for the first signal 870, a second $T_{off}$ 882 for the second signal 872, and a third $T_{off}$ 884 for the third signal 884. Additionally, each signal has its respective amplitude, such as a first amplitude 890, a second amplitude 892, and a third amplitude 894.

In FIG. 8B, each of the MOSFETs are gated ON simultaneously then gated OFF sequentially. In this embodiment, the first signal 870, the second signal 872, and the third signal 874 have different pulse widths (e.g., 871, 873 and 875 are not equal), and, in this embodiment, the output voltage amplitude (e.g., combination of 890, 892, and 894) is progressively decreased. For example, all three MOSFETs are gated on at the beginning of the pulse creating a first output voltage signal 878 by combining the first signal 870, the second signal 872, and the third signal 874. The first output voltage signal has an amplitude 895 equal to the sum of the first amplitude 890, the second amplitude 892, and the third amplitude 894. Because the first output voltage signal is a combination of all three signals 870, 872, and 873, the pulse width of the first output voltage signal is equal to the shortest pulse width of the three signals (e.g., the third pulse width 875). When the third MOSFET is gated OFF, a second output voltage signal 876 is created by the combination of the first signal 870 and the second signal 874. The second output voltage signal has an amplitude 893 equal to the sum of the first amplitude 890 and the second amplitude 892. Because the second output voltage 876 is a combination of the first signal 870 and the second signal 872, the second output voltage 876 has a pulse width equal to the shortest pulse width between the first signal 870 and the second signal 872 (e.g., the second pulse width 873).

Figure 9:
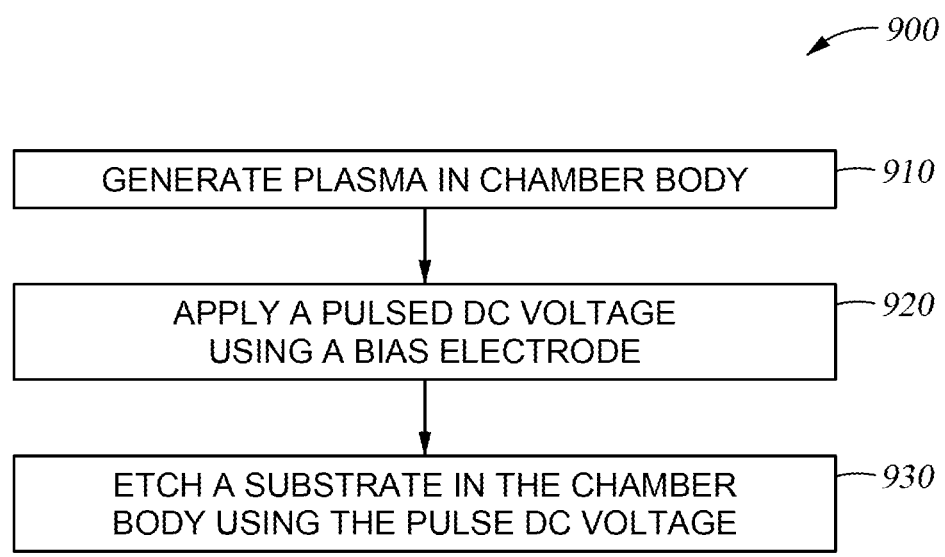
FIG. 9 is a process flow diagram illustrating a method for waveform generation.

FIG. 9 is a process flow diagram illustrating a method 900 for etching using a pulsed waveform. In operation 910, a plasma 101 is generated in a chamber body 124. In operation 920, a pulsed DC voltage 153 is applied to the plasma 101 using a bias electrode 104 capacitively coupled to the plasma 101 through a dielectric layer 105B.

Applying a pulsed DC voltage in operation 920 may include using a DC voltage source (e.g., DC voltage source 210) connected to a first capacitor (e.g., first capacitor 220) via its positive terminal and a first diode (e.g., first diode 230), the positive terminal of the DC voltage source (e.g., DC voltage source 210) further connected to a first resistor (e.g., first resistor 240), first MOSFET (e.g., first MOSFET 250), and first blocking diode (e.g., first blocking diode 270).

A second capacitor (e.g., second capacitor 222) may be connected in series with between the first diode (e.g., first diode 230) and ground (e.g., ground 228). The DC voltage source (e.g., DC voltage source 210) may also be coupled to a second diode (e.g., second diode 232) connected in series between the second capacitor (e.g., second capacitor 222) and ground (e.g., ground 228). A second resistor (e.g., second resistor 242) may be connected at the common point of the first diode (e.g., first diode 230) and the second capacitor (e.g., second capacitor 222). A second MOSFET (e.g., second MOSFET 252) may be connected in series to the second resistor (e.g., second resistor 242), a second gate voltage source (e.g., second gate voltage source 262) connected to a gate terminal of the second MOSFET (e.g., second MOSFET 252), and a second blocking diode (e.g., second blocking diode 272) connected to a source terminal (e.g., 253) of the second MOSFET (e.g., second MOSFET 252). Further, a third resistor (e.g., third resistor 244) may be connected at the common point of the second diode (e.g., second diode 232) and the third capacitor (e.g., third capacitor 224) between the second diode (e.g., second diode 232) and third capacitor (third capacitor 224). A third MOSFET (e.g., third MOSFET 254), a third gate voltage source (e.g., third gate voltage source 264), and third blocking diode (e.g., third blocking diode 274) may also be connected in series with the third resistor (e.g., third resistor 244), where the cathode of the third blocking diode (e.g., third blocking diode 274) is connected to the bias electrode (e.g., bias electrode 104). The full supply voltage will be applied to the load when all the MOSFETs are gated ON at the same time and the widths of the gating signals are identical.

In operation 920, applying a pulsed DC voltage source (e.g., DC voltage source 210) may further include switching the first MOSFET (e.g., first MOSFET 250) ON for a first duration (e.g., first duration 620), switching the second MOSFET (e.g., second MOSFET 252) ON for a second duration (e.g., second duration 622), and switching the third MOSFET (e.g., third MOSFET 254) for a third duration (e.g., third duration 624). In some embodiments, the first duration (e.g., first duration 420), second duration (e.g., second duration 622), the third duration (e.g., third duration 624), or a combination thereof may overlap. Alternatively, the first duration (e.g., first duration 620), second duration (e.g., second duration 422), and the third duration (e.g., third duration 624) may not overlap. In operation 920, the first gate voltage source (e.g., first gate voltage source 260) may provide a first $T_{off}$ (e.g., first $T_{off}$ 630), the second gate voltage source (e.g., second gate voltage source 262) may provide a second $T_{off}$ (e.g., second $T_{off}$ 632), and the third gate voltage source (e.g., third gate voltage source 264) may provide a third $T_{off}$ (e.g., third $T_{off}$ 634). In operation 920, the first MOSFET (e.g., first MOSFET 250) receives a first gating signal from the first gate voltage source (e.g., first gate voltage source 260), where the first gating signal has a first pulse width (e.g., first pulse width 620). Further, the second MOSFET (e.g., second MOSFET 252) may receive a second gating signal from the second gate voltage source (e.g., second gate voltage source 262), where the second gating signal has a second pulse width (e.g., second pulse width 622). Further, the third MOSFET (e.g., third MOSFET 254) may receive a third gating signal from the third gate voltage source (e.g., third gate voltage source 264), where the third gating signal has a third pulse width (e.g., third pulse width 624). In some embodiments, the first pulse width (e.g., first pulse width 620), the second pulse width (e.g., second pulse width 622), and the third pulse width (e.g., third pulse width 624) are different. The memory 134, the CPU 133, and the support circuits 135 of the system controller 126 may implement method 900 in an embodiment of the present disclosure. In operation 930, a substrate 103 is etched in the chamber body 124 using the pulsed DC voltage 153 applied to the plasma 101.

The term "coupled" is used herein to refer to the direct or indirect coupling between two objects. For example, if object A physically touches object B and object B touches object C, the objects A and C may still be considered coupled to one another—even if objects A and C do not directly physically touch each other. For instance, a first object may be coupled to a second object even though the first object is never directly in physical contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A system for reactive ion etching, comprising:
   a chamber body;
   a substrate support within the chamber body;
   a bias electrode within the substrate support; and
   a bias voltage source configured to supply a pulsed biasing voltage to the bias electrode, the bias voltage source comprising:
     a DC voltage source;
     a first capacitor connected to the DC voltage source;
     a ground;
     a first diode in series between the first capacitor and ground;
     a first resistor connected to the DC voltage source;
     a first metal oxide semiconductor field effect transistor in series with the first resistor;
     a first gate voltage source connected to a gate of the first metal oxide semiconductor field effect transistor;
     a first blocking diode connected to a source of the first metal oxide semiconductor field effect transistor;
     a second capacitor in series between the first diode and ground;
     a second diode in series between the second capacitor and ground;
     a second resistor connected between the first diode and the second capacitor;
     a second metal oxide semiconductor field effect transistor in series with the second resistor;
     a second gate voltage source connected to a gate of the second metal oxide semiconductor field effect transistor; and
     a second blocking diode connected to a source of second first metal oxide semiconductor field effect transistor.

2. The system of claim 1, wherein the bias voltage source further comprises a third capacitor connected in series with between the second diode and ground.

3. The system of claim 2, wherein the bias voltage source further comprises a third resistor connected in parallel with the third capacitor, a third metal oxide semiconductor field effect transistor connected in series to the third resistor, a third gate voltage source connected to a gate terminal of the third metal oxide semiconductor field effect transistor, and a third blocking diode connected to a source terminal of the third metal oxide semiconductor field effect transistor.

4. The system of claim 1, wherein the bias electrode is electrically coupled to the second blocking diode of the bias voltage source.

5. The system of claim 2, wherein an anode of the first blocking diode is connected to the source of the first metal oxide semiconductor field effect transistor.

6. The system of claim 3, wherein a cathode of the first blocking diode is connected to a cathode of the second blocking diode.

7. The system of claim 6, wherein a cathode of the third blocking diode is connected to the cathode of the first blocking diode and the cathode of the second blocking diode.

8. The system of claim 7, wherein the cathode of the third blocking diode, the cathode of the second blocking diode, and the cathode of the third blocking diode are connected to the bias electrode.

9. The system of claim 1, further comprising a controller configured to cause the bias voltage source to transmit a pulse to the bias electrode, the pulse comprising a plurality of signals, and the plurality of signals comprise different pulse widths or different amplitudes.

10. The system of claim 9, wherein the plurality of signals further comprise different off-times.

11. A method for etching using a pulsed waveform, comprising: generating a plasma in a chamber body; applying a pulsed DC voltage to the plasma using a bias electrode capacitively coupled to the plasma through a dielectric layer, wherein the pulsed DC voltage comprises a plurality of pulses, each of the plurality of pulses further comprising a plurality of signals, and wherein each of the plurality of signals has an off-time, a pulse width, and an amplitude; and etching a substrate in the chamber body using the pulsed DC voltage applied to the plasma; wherein two or more of each of the off-times, the pulse widths, and the amplitudes of the plurality of signals is different; wherein applying a pulsed DC voltage comprises using a DC voltage source connected to a first capacitor and a first diode, the DC voltage source further connected in parallel to a first resistor, a first metal oxide semiconductor field effect transistor, a first gate voltage source connected to a gate of the first metal oxide semiconductor field effect transistor, and a first blocking diode; wherein the DC voltage source is connected in series to a second capacitor connected in series with between the first diode and ground, a second diode connected in series between the second capacitor and ground, a second resistor connected in parallel with the second capacitor, a second metal oxide semiconductor field effect transistor connected in series to the second resistor, a second gate voltage source connected to a gate terminal of the second metal oxide semiconductor field effect transistor, and a second blocking diode connected to a source terminal of the second metal oxide semiconductor field effect transistor.

12. The method of claim 11, wherein applying a pulsed DC voltage source further comprises switching the first metal oxide semiconductor field effect transistor ON for a first duration and switching the second metal oxide semiconductor field effect transistor ON for a second duration.

13. The method of claim 12, wherein the first duration and second duration do not overlap.

14. The method of claim 11, wherein the first gate voltage source comprises a first off-time and the second gate voltage source comprises a second off-time.

15. The method of claim 11, wherein the first metal oxide semiconductor field effect transistor receives a first gating signal from the first gate voltage source, the first gating signal having a first pulse width, and wherein the second metal oxide semiconductor field effect transistor receives a second gating signal from the second gate voltage source, the second gating signal having a second pulse width.

16. A pulsed signal source device for etching, comprising:
a controller;
a bias electrode; and
a bias voltage source configured to supply a pulsed biasing voltage to the bias electrode, the bias voltage source comprising:
a DC voltage source;
a first capacitor connected in series with the DC voltage source;
a first diode connected with the first capacitor;
a ground connected in series with the first diode;
a first resistor connected in parallel with the first capacitor;
a first metal oxide semiconductor field effect transistor connected in series to the first resistor;
a first gate voltage source connected to a gate terminal of the first metal oxide semiconductor field effect transistor;
a second capacitor connected in series with between the first diode and ground;
a second diode connected in series between the second capacitor and ground;
a second resistor connected in parallel with the second capacitor;
a second metal oxide semiconductor field effect transistor connected in series to the second resistor;
a second gate voltage source connected to a gate terminal of the second metal oxide semiconductor field effect transistor;
a second blocking diode connected to a source terminal of the second metal oxide semiconductor field effect transistor;
a third capacitor connected in series with between the second diode and ground;
a third resistor connected in parallel with the third capacitor;
a third metal oxide semiconductor field effect transistor connected in series to the third resistor;
a third gate voltage source connected to a gate terminal of the third metal oxide semiconductor field effect transistor; and
a third blocking diode connected to a source terminal of the third metal oxide semiconductor field effect transistor.

17. The pulsed signal source device of claim 16, wherein the controller causes the first metal oxide semiconductor field effect transistor to receive a first gating signal from the first gate voltage source, the first gating signal having a first pulse width, wherein controller causes the second metal oxide semiconductor field effect transistor to receive a second gating signal from the second gate voltage source, the second gating signal having a second pulse width, wherein the controller causes the third metal oxide semiconductor field effect transistor to receive a third gating signal from the third gate voltage source, the third gating signal having a third pulse width, and wherein the first pulse width, the second pulse width, and the third pulse width are different.

* * * * *